(12) United States Patent
Wang et al.

(10) Patent No.: US 9,379,255 B2
(45) Date of Patent: Jun. 28, 2016

(54) NON-VOLATILE MEMORY CELL HAVING A FLOATING GATE AND A COUPLING GATE WITH IMPROVED COUPLING RATIO THEREBETWEEN

(75) Inventors: Chunming Wang, Shanghai (CN); Baowei Qiao, Shanghai (CN); Zufa Zhang, Shanghai (CN); Yi Zhang, Shanghai (CN); Shiuh Luen Wang, San Jose, CA (US); Wen-Juei Lu, Cupertino, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 122 days.

(21) Appl. No.: 14/125,029

(22) PCT Filed: Jul. 16, 2012

(86) PCT No.: PCT/US2012/046947
§ 371 (c)(1),
(2), (4) Date: Feb. 14, 2014

(87) PCT Pub. No.: WO2013/032585
PCT Pub. Date: Mar. 7, 2013

(65) Prior Publication Data
US 2014/0203343 A1 Jul. 24, 2014

(30) Foreign Application Priority Data
Aug. 31, 2011 (CN) .......................... 2011 1 0289174

(51) Int. Cl.
*H01L 29/788* (2006.01)
*H01L 21/28* (2006.01)
*H01L 29/423* (2006.01)
*H01L 29/66* (2006.01)
*H01L 27/115* (2006.01)

(52) U.S. Cl.
CPC ........ *H01L 29/788* (2013.01); *H01L 21/28273* (2013.01); *H01L 27/11521* (2013.01); *H01L 29/42324* (2013.01); *H01L 29/42328* (2013.01); *H01L 29/66825* (2013.01); *H01L 29/7881* (2013.01)

(58) Field of Classification Search
USPC .......................... 257/315, 314; 438/257, 265
See application file for complete search history.

(56) References Cited

U.S. PATENT DOCUMENTS

| 6,136,652 A | 10/2000 | Hazani |
| 6,747,310 B2 | 6/2004 | Fan et al. |

(Continued)

FOREIGN PATENT DOCUMENTS

| CN | 101364614 A | 2/2009 |
| JP | 2004-104107 | 4/2004 |

(Continued)

OTHER PUBLICATIONS

PCT Search Report mailed on Oct. 5, 2012 corresponding to the related PCT Patent Application No. US12/46947.

(Continued)

*Primary Examiner* — Errol Fernandes
(74) *Attorney, Agent, or Firm* — DLA Piper LLP (US)

(57) ABSTRACT

A non-volatile memory cell having a split gate, wherein the floating gate and the coupling/control gate have complimentary non-planar shapes. The shape may be a step shape. An array of such cells and a method of manufacturing the cells are also disclosed.

10 Claims, 3 Drawing Sheets

(56) References Cited

U.S. PATENT DOCUMENTS

| | | |
|---|---|---|
| 7,868,375 B2 | 1/2011 | Liu et al. |
| 2001/0000112 A1 | 4/2001 | Lin et al. |
| 2006/0202255 A1 | 9/2006 | Jeon et al. |
| 2008/0042183 A1 | 2/2008 | Mokhlesi |
| 2009/0011588 A1 | 1/2009 | Kim |
| 2009/0039410 A1 | 2/2009 | Liu et al. |
| 2010/0054043 A1 | 3/2010 | Liu et al. |

FOREIGN PATENT DOCUMENTS

| | | |
|---|---|---|
| JP | 2006-261668 | 9/2006 |
| JP | 2009-44164 | 2/2009 |

OTHER PUBLICATIONS

Japanese Office Action dated Mar. 23, 2015 corresponding to the related Japanese Patent Application No. 2014-528393. (English and Japanese translations).

European Search Report dated Mar. 31, 2015 corresponding to the related European Patent Application No. 12828535.0.

Chinese Office Action issued on Sep. 3, 2014 corresponding to the related Chinese Patent Application No. 201110289174.0. (Chinese Translation Only).

NON-VOLATILE MEMORY CELL HAVING A FLOATING GATE AND A COUPLING GATE WITH IMPROVED COUPLING RATIO THEREBETWEEN

TECHNICAL FIELD

The present invention relates to a non-volatile memory cell having a floating gate and a coupling gate with an increase in coupling ratio between the floating gate and the coupling gate.

BACKGROUND OF THE INVENTION

Non-volatile memory cells having a floating gate for the storage of charges thereon are well known in the art. Referring to FIG. 1 there is shown a cross-sectional view of a non-volatile memory cell 10 of the prior art. The memory cell 10 comprises a semiconductor substrate 12, of a first conductivity type, such as P type. At or near a surface of the substrate 12 is a first region 14 of a second conductivity type, such as N type. Spaced apart from the first region 14 is a second region 16 also of the second conductivity type. Between the first region 14 and the second region 16 is a channel region 18. A word line 20, made of polysilicon is positioned over a first portion of the channel region 18. The word line 20 is spaced apart from the channel region 18 by a silicon (di)oxide layer 22. Immediately adjacent to and spaced apart from the word line 20 is a floating gate 24, which is also made of polysilicon, and is positioned over another portion of the channel region 18. The floating gate 24 is separated from the channel region 18 by another insulating layer 30, typically also of silicon (di)oxide. A coupling gate 26, also made of polysilicon is positioned over the floating gate 24 and is insulated therefrom by another insulating layer 32. On another side of the floating gate 24, and spaced apart therefrom, is an erase gate 28, also made of polysilicon. The erase gate 28 is positioned over the second region 16 and is insulated therefrom. The erase gate 28 is also immediately adjacent to but spaced apart from the coupling gate 26 and to another side of the coupling gate 26. The erase gate 28 has a slight overhang over the floating gate 24. In the operation of the memory cell 10, charges stored on the floating gate 24 (or the absence of charges on the floating gate 24) control the flow of current between the first region 14 and the second region 16. Where the floating gate 24 has charges thereon, the floating gate 24 is programmed. Where the floating gate 24 does not have charges thereon, the floating gate 24 is erased. The memory cell 10 is fully disclosed in U.S. Pat. No. 7,868,375 and in U.S. Pat. No. 6,747,310 whose disclosures are incorporated herein in their entirety by reference.

The memory cell 10 operates as follows. During the programming operation, when charges are stored on the floating gate 24, a first positive voltage in the shape of a pulse is applied to the word line 20 causing the portion of the channel region 18 under the word line 20 to be conductive. A second positive voltage, also in the shape of a pulse, is applied to the coupling gate 26. A third positive voltage, also in the shape of a pulse, is applied to the erase gate 28. A voltage differential also in the shape of a pulse, is applied between the first region 14 and the second region 16. All of the first positive voltage, second positive voltage, third positive voltage and the voltage differential are applied substantially at the same time, and terminate substantially at the same time. The electrons from the first region 14 are attracted to the positive voltage at the second region 16. As they near the floating gate 24, they experience a sudden increase in the electric field caused by the voltage applied to the coupling gate 26 and the erase gate 28, causing the charges to be injected onto the floating gate 24. Thus, programming occurs through the mechanism of hot electron injection.

During the erase operation when charges are removed from the floating gate 24, a high positive voltage is applied to the erase gate 28. A ground voltage can be applied to the coupling gate 26 and/or the word line 20. Charges on the floating gate 24 are attracted to the erase gate 28 by tunneling through the insulating layer between the floating gate 24 and the erase gate 28. In particular, the floating gate 24 may be formed with a sharp tip facing the erase gate 28, thereby facilitating the Fowler-Nordheim tunneling of electrons from the floating gate 24 through the tip and through the insulating layer between the floating gate 24 and the erase gate 28 onto the erase gate 28. As disclosed in U.S. Pat. No. 7,868,375 and U.S. Pat. No. 6,747,310, it may be beneficial to have a sharp edge or tip between the side wall of the floating gate 24 and the top surface of the floating gate 24 so that electrons may more readily tunnel from the floating gate 24 to the erase gate 28 during the erase operation.

During the read operation, a first positive voltage is applied to the word line 20 to turn on the portion of the channel region 18 beneath the word line 20. A second positive voltage is applied to the coupling gate 26. A voltage differential is applied to the first region 14 and the second region 16. If the floating gate 24 were programmed, i.e. the floating gate 24 stores electrons, then the second positive voltage applied to the coupling gate 26 is not able to overcome the negative electrons stored on the floating gate 24 and the portion of the channel region 18 beneath the floating gate 24 remains non-conductive. Thus, no current or a minimal amount of current would flow between the first region 14 and the second region 16. However, if the floating gate 24 were not programmed, i.e. the floating gate 24 remains neutral or perhaps even stores some holes, then the second positive voltage applied to the coupling gate 26 is able to cause the portion of the channel region 18 beneath the floating gate 24 to be conductive. Thus, a current would flow between the first region 14 and the second region 16.

As can be seen from the foregoing operations, one of the important parameters is the coupling ratio between the coupling gate 26 and the floating gate 24. For example, during the programming operation, a programming pulse applied to the coupling gate 26, which is capacitively coupled to the floating gate. In the memory cell 10 of the prior art shown in FIG. 1, the floating gate 24 has an upper surface which has a planar contour, with the coupling gate 26 having a lower surface having the same planar contour. As the memory cell 10 is scaled, i.e. its geometry is shrunk, the dimensions of the capacitive coupling between the coupling gate 26 And the floating gate 24 decreases. Hence to continue to have effective operation, it is desired to increase the coupling ratio between the coupling gate 26 and the floating gate 24 without increasing the size of the floating gate 24 or the coupling gate 26.

SUMMARY OF THE INVENTION

Accordingly, in the present invention a non-volatile memory cell has a semiconductor substrate of a first conductivity type with a top surface. A first region of a second conductivity type is in the substrate along the top surface. A second region of the second conductivity type is in the substrate along the top surface, spaced apart from the first region. A channel region is between the first region and the second region. A word line gate is positioned over a first portion of the channel region, immediately adjacent to the first region. The word line gate is spaced apart from the channel region by a first insulating layer. A floating gate is positioned over another portion of the channel region. The floating gate has a lower surface separated from the channel region by a second insulating layer, and an upper surface opposite the lower surface. The floating gate also has a first side wall adjacent to but separated from the word line gate; and a second side wall opposite the first side wall. The upper surface of the floating gate has a non-planar contour from the first side wall to the second side wall. A coupling gate is positioned over the upper surface of the floating gate and is insulated therefrom by a third insulating layer. The coupling gate has a lower surface that has a contour that follows the contour of the upper surface of the floating gate. An erase gate is positioned adjacent to the second side wall of the floating gate. The erase gate is positioned over the second region and is insulated therefrom.

The present invention also relates to an array of the foregoing described memory cells and a method of making the foregoing described memory cell.

DETAILED DESCRIPTION OF THE PREFERRED EMBODIMENT

Figure 1:
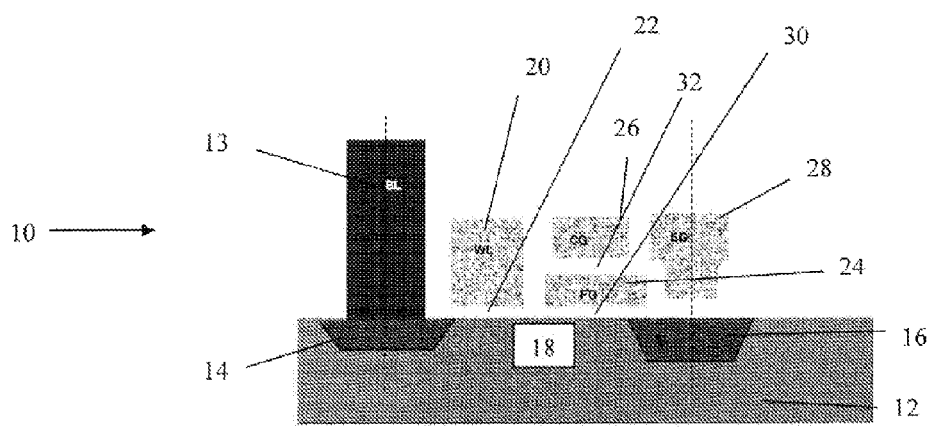
FIG. 1 is a cross-sectional view of a non-volatile memory cell of the prior art with a floating gate for the storage of charges thereon and a separate coupling gate.
Figure 2:
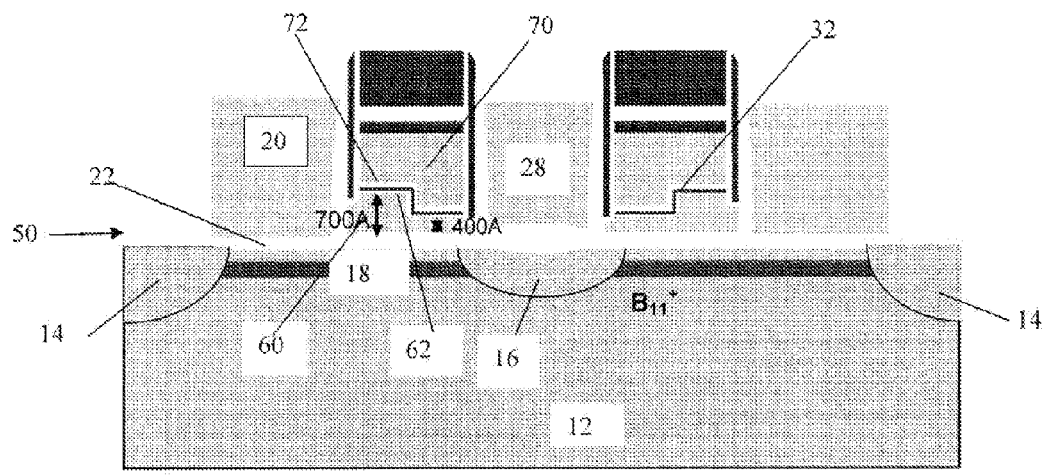
FIG. 2 is a cross-sectional view of a memory cell of one embodiment of the present invention with a floating gate and a separate coupling gate with improved coupling ratio therebetween.

Referring to FIG. 2 there is shown a cross-sectional view of a first embodiment of a non-volatile memory cell 50 of the present invention. The memory cell 50 is similar to the memory cell 10 shown in FIG. 1. Thus, like parts will be designated with like numerals.

The memory cell 50 is formed in a semiconductor substrate 12, of a first conductivity type, such as P type. Typical implant used to form the P type is Boron B11, which is implanted into the substrate 12, to a depth of approximately 2000 Angstrom. At or near a surface of the substrate 12 is a first region 14 of a second conductivity type, such as N type. Spaced apart from the first region 14 is a second region 16 also of the second conductivity type. Between the first region 14 and the second region 16 is a channel region 18. A word line 20, made of polysilicon is positioned over a first portion of the channel region 18. The word line 20 is spaced apart from the channel region 18 by a silicon (di)oxide layer 22. Immediately adjacent to and spaced apart from the word line 20 is a floating gate 60, which is also made of polysilicon, and is positioned over another portion of the channel region 18. The floating gate 60 is separated from the channel region 18 by another insulating layer 30, typically also of silicon (di)oxide. The floating gate 60 has a lower surface which rests on the insulating layer 30. The floating gate 60 has an upper surface 62 opposite the lower surface. On opposite sides of the floating gate 60 are a first side wall and a side wall, with the first side wall closest to the word line gate 20. The upper surface 62 of the floating gate has a surface contour which is not planar. The non-planarity of contour of the upper surface 62 may be from the first wall to the second wall or can be in a direction perpendicular to that, i.e. in and out of the page. A coupling gate 70, also made of polysilicon is positioned over the floating gate 60 and is insulated therefrom by another insulating layer 32. The coupling gate 70 has a lower surface 72. The insulating layer 32 is substantially uniform in thickness with the lower surface 72 immediately adjacent to the insulating layer 32. Thus, the lower surface 72 also has a non-planar contour with the contour of the lower surface 72 following the contour of the upper surface 62 of the floating gate 60. In a preferred embodiment, each of the upper surface 62 of the floating gate 60 and the lower surface 72 of the coupling gate 70 has a step shape in the contour.

On another side of the floating gate 60, and spaced apart therefrom, is an erase gate 28, also made of polysilicon. The erase gate 28 is positioned over the second region 16 and is insulated therefrom. The erase gate 28 is also immediately adjacent to but spaced apart from the coupling gate 70 and to another side of the coupling gate 70. The erase gate 28 is adjacent to the second side wall of the floating gate 60 and has a slight overhang over the floating gate 60. In the operation of the memory cell 50, charges stored on the floating gate 60 (or the absence of charges on the floating gate 60) control the flow of current between the first region 14 and the second region 16. Where the floating gate 60 has charges thereon, the floating gate 60 is programmed. Where the floating gate 60 does not have charges thereon, the floating gate 60 is erased.

In the embodiment shown in FIG. 2, the floating gate 60 of the memory cell 50 has its first sidewall, which is adjacent to the word line gate 20 and has a thickness on the order of 700 Å. The second side wall, which is adjacent to the erase gate 28, has a thickness on the order of 400 Å. Thus, the first side wall is thicker than the second side wall.

Figure 3:
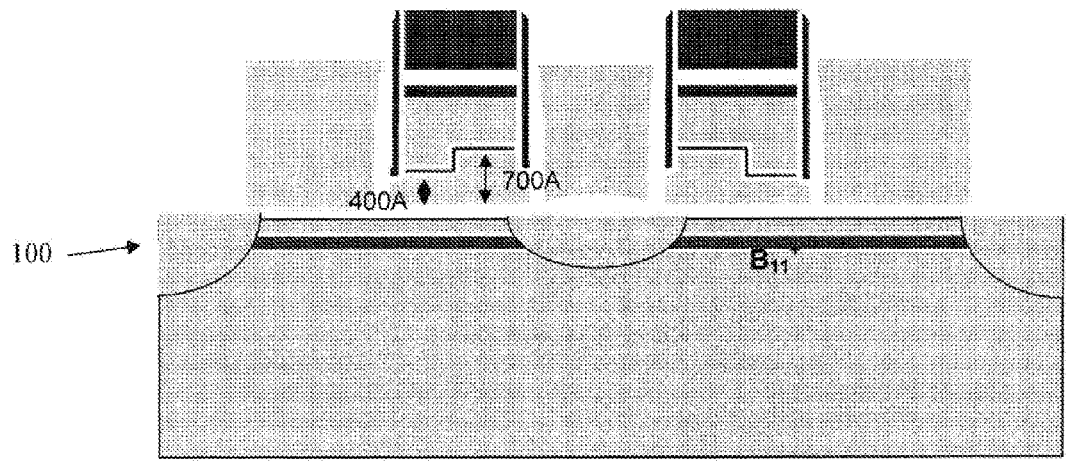
FIG. 3 is a cross-sectional view of a memory cell of another embodiment of the present invention with a floating gate and a separate coupling gate with improved coupling ratio therebetween.

Referring to FIG. 3 there is shown a cross-sectional view of a second embodiment of a non-volatile memory cell 100 of the present invention. The memory cell 100 is similar to the memory cell 50 shown in FIG. 2. Thus, like parts will be designated with like numerals.

The memory cell 100 is formed in a semiconductor substrate 12, of a first conductivity type, such as P type. Typical implant used to form the P type is Boron B11, which is implanted into the substrate 12, to a depth of approximately 2000 Angstrom. At or near a surface of the substrate 12 is a first region 14 of a second conductivity type, such as N type. Spaced apart from the first region 14 is a second region 16 also of the second conductivity type. Between the first region 14 and the second region 16 is a channel region 18. A word line 20, made of polysilicon is positioned over a first portion of the channel region 18. The word line 20 is spaced apart from the channel region 18 by a silicon (di)oxide layer 22. Immediately adjacent to and spaced apart from the word line 20 is a floating gate 60, which is also made of polysilicon, and is positioned over another portion of the channel region 18. The floating gate 60 is separated from the channel region 18 by another insulating layer 30, typically also of silicon (di)oxide. The floating gate 60 has a lower surface which rests on the insulating layer 30. The floating gate 60 has an upper surface 62 opposite the lower surface. On opposite sides of the floating gate 60 are a first side wall and a side wall, with the first side wall closest to the word line gate 20. The upper surface 62 of the floating gate has a surface contour which is not planar. The non-planarity of contour of the upper surface 62 may be from the first wall to the second wall or can be in a direction perpendicular to that, i.e. in and out of the page. A coupling gate 70, also made of polysilicon is positioned over the floating gate 60 and is insulated therefrom by another insulating layer 32. The coupling gate 70 has a lower surface 72. The insulating layer 32 is substantially uniform in thickness with the lower surface 72 immediately adjacent to the insulating layer 32. Thus, the lower surface 72 also has a non-planar contour with the contour of the lower surface 72 following the contour of the upper surface 62 of the floating gate 60. In a preferred embodiment, each of the upper surface 62 of the floating gate 60 and the lower surface 72 of the coupling gate 70 has a step shape in the contour.

On another side of the floating gate 60, and spaced apart therefrom, is an erase gate 28, also made of polysilicon. The erase gate 28 is positioned over the second region 16 and is insulated therefrom. The erase gate 28 is also immediately adjacent to but spaced apart from the coupling gate 70 and to another side of the coupling gate 70. The erase gate 28 is adjacent to the second wall of the floating gate 60 and has a slight overhang over the floating gate 60. In the operation of the memory cell 100, charges stored on the floating gate 60 (or the absence of charges on the floating gate 60) control the flow of current between the first region 14 and the second region 16. Where the floating gate 60 has charges thereon, the floating gate 60 is programmed. Where the floating gate 60 does not have charges thereon, the floating gate 60 is erased.

The only difference between the embodiment shown in FIG. 3 and the embodiment shown in FIG. 2 is that in the embodiment shown in FIG. 3, the floating gate 60 of the memory cell 50 has its first sidewall, which is adjacent to the word line gate 20 shorter than its second side wall, which is adjacent to the erase gate 28. Thus, the floating gate 60 of the memory cell 50 has its first sidewall, which is adjacent to the word line gate 20 and has a thickness on the order of 400 Å. The second side wall, which is adjacent to the erase gate 28, has a thickness on the order of 700 Å.

Figure 5:
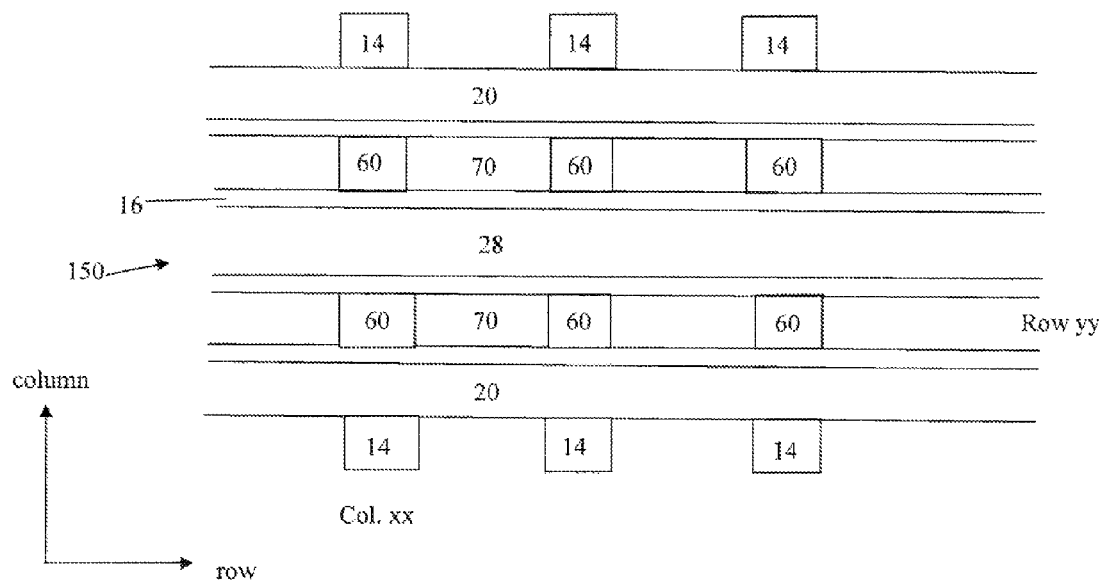
FIG. 5 is a top view of an array of the present invention with the memory cell of the present invention.

Referring to FIG. 5, there is shown a top view of an array 150 of memory cells using either the memory cells 50 (shown in FIG. 2) or the memory cells 100 (shown in FIG. 3) of the present invention. The plurality of memory cells 50 or 100 are arranged so that each memory cell 50 or 100, defined by a first region 14 and its associated second region 16, and the channel region 18 therebetween extends in a column direction. Further each word line 20 extends in a row direction connecting a plurality of memory cells 50 or 100 in different columns. In addition, each coupling gate 70 also extends in a row direction connecting a plurality of memory cells 50 or 100 in different columns. The coupling gate 70 overlies a floating gate 60 at each column, with the lower surface of the coupling gate 70 following the non-planar contour of the upper surface of the floating gate 60. Further, the erase gate 28 extends in a row direction and is shared by a pair of memory cells 50 or 100 in each column. Finally, the second region 16, under the erase gate 28, extends in a row direction connecting a plurality of memory cells 50 or 100 in different columns.

Figure 4A:
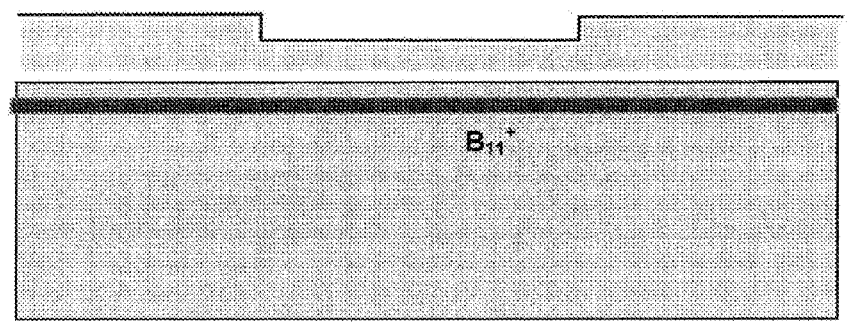
FIG. 4(*a-b*) are cross-sectional views of the process steps to make the floating gate and coupling gate with improved coupling ratio in the memory cell of the present invention.

Referring to FIG. 4(a), there is shown a first step in the method of making either the memory cell 50 or 100 of the present invention. The memory cell 50 or 100 is very similar to the memory cell 10 shown in FIG. 1. The only difference as discussed heretofore, is the shape of the contour of the upper surface of the floating gate 60. Thus, all of the steps in forming the polysilicon which eventually forms the floating gate 60 are the same as the steps used in the formation of the floating gate 24 shown in FIG. 1. After the polysilicon 60 is formed, on an oxide layer 30, it has an upper surface 62 which is planar shaped. The upper surface 62 is then subject to masking step and the upper surface 62 is then etched, creating a step in the upper surface, 62 which results in a non-planar shaped contour in the upper surface 62. The step created in the upper surface 62 can be of the shape shown in FIG. 3, which eventually forms a floating gate 60 with its first sidewall closest to the word line gate 20 being taller than the second sidewall closest to the erase gate 28, resulting in the memory cell 50. Alternatively, the step created in the upper surface 62 can be of the shape inverse to that shown in FIG. 3, which eventually forms a floating gate 60 with its first sidewall closest to the word line gate 20 being shorter than the second sidewall closest to the erase gate 28, resulting in the memory cell 100.

After the uppers surface 62 of the floating gate 60 is etched to form the non-planar upper surface 62, a layer of insulating material 32 is then deposited. The thickness of the insulating material 32 is such that it uniformly follows the shape of the non-planar contour of the upper surface 62 of the floating gate 60. The resultant structure is shown in FIG. 4a.

Figure 4B:
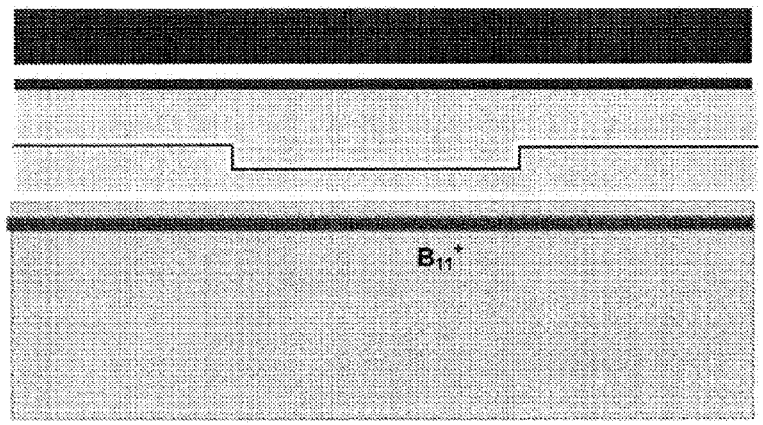

Thereafter, a layer of polysilicon 70 is deposited, which eventually forms the coupling gate 70. The layer 70 has a lower surface that is immediately adjacent to the insulating layer 32, and follows the shape of the non-planar contour of the upper surface 62 of the floating gate. The resultant structure is shown in FIG. 4b.

The structure is then processed per the same processing steps used to make the floating gate 10 after the coupling gate polysilicon is deposited. The resultant memory cell 50 or 100 is then formed.

From the foregoing it can be see that because the upper surface 62 of the floating gate has a non-planar contour, and the lower surface of the coupling gate 72 follow the shape of that non-planar contour that an increase in coupling ratio between the floating gate 60 and the coupling gate 70 is created without increasing the linear dimensions of the floating gate 60 and the coupling gate 70.

What is claimed is:
1. A non-volatile memory cell comprising:
a semiconductor substrate of a first conductivity type having a top surface;
a first region of a second conductivity type in said substrate along the top surface;
a second region of the second conductivity type, in said substrate along the top surface, spaced apart from the first region;
a channel region between the first region and the second region;
a word line gate positioned over a first portion of the channel region, immediately adjacent to the first region, said word line gate spaced apart from the channel region by a first insulating layer;
a floating gate positioned over another portion of the channel region, said floating gate having a lower surface separated from the channel region by a second insulating layer, and an upper surface opposite the lower surface; said floating gate having a first side wall adjacent to but separated from the word line gate; and a second side wall opposite the first side wall, wherein said upper surface having a non-planar contour from said first side wall to said second side wall;
a coupling gate positioned over the upper surface of the floating gate and insulated therefrom by a third insulating layer, said coupling gate having a lower surface that has a contour that follows the contour of said upper surface of said floating gate; and
an erase gate positioned adjacent to the second side wall of the floating gate; said erase gate positioned over the second region and insulated therefrom;

wherein said upper surface of said floating gate has a single step like non-planar contour such that the second side wall is taller than said first side wall.

2. The memory cell of claim 1 wherein said erase gate overhangs a portion of said floating gate.

3. An array of non-volatile memory cells comprising:
- a semiconductor substrate of a first conductivity type having a top surface;
- a plurality of memory cells arranged in an array with a plurality of rows and a plurality of columns; each of said memory cells comprising a first region of a second conductivity type in said substrate along the top surface; a second region of the second conductivity type, in said substrate along the top surface, spaced apart from the first region in a column direction, with a channel region between the first region and the second region, each of said channel region having a first portion and a second portion, with the first portion immediately adjacent to the first region;
- a word line gate, extending in a row direction perpendicular to the column direction, positioned over a plurality of the first portion of channel regions, said word line gate spaced apart from each channel region by a first insulating layer;
- a floating gate positioned over the second portion of each channel region, said floating gate having a lower surface separated from the channel region by a second insulating layer, and an upper surface opposite the lower surface; said floating gate having a first side wall adjacent to but separated from the word line gate; and a second side wall opposite the first side wall, wherein said upper surface having a non-planar contour from said first side wall to said second side wall;
- a coupling gate, extending in the row direction, positioned over the upper surface of a plurality of floating gates and insulated therefrom by a third insulating layer, said coupling gate having a lower surface that has a contour that follows the contour of said upper surface of said floating gate; and
- an erase gate, extending in the row direction across a plurality of columns and positioned adjacent to the second side wall of a plurality of floating gates; said erase gate positioned over the second region and insulated therefrom;
- wherein said upper surface of each of said floating gates has a single step like non-planar contour such that said second side wall of each floating gate is taller than said first side wall of each floating gate.

4. The array of claim 3 wherein said second region extends in the row direction across a plurality of columns.

5. The array of claim 4 wherein said erase gate overhangs a portion of each of said plurality of floating gates.

6. A non-volatile memory cell comprising:
- a semiconductor substrate of a first conductivity type having a top surface;
- a first region of a second conductivity type in said substrate along the top surface;
- a second region of the second conductivity type, in said substrate along the top surface, spaced apart from the first region;
- a channel region between the first region and the second region;
- a word line gate positioned over a first portion of the channel region, immediately adjacent to the first region, said word line gate spaced apart from the channel region by a first insulating layer;
- a floating gate positioned over another portion of the channel region, said floating gate having a lower surface separated from the channel region by a second insulating layer, and an upper surface opposite the lower surface; said floating gate having a first side wall adjacent to but separated from the word line gate; and a second side wall opposite the first side wall, wherein said upper surface having a non-planar contour from said first side wall to said second side wall;
- a third insulating layer on said upper surface of said floating gate, said third insulating layer having a uniform thickness extending from said first side wall to said second side wall;
- a coupling gate positioned over said third insulating layer; and
- an erase gate positioned adjacent to the second side wall of the floating gate; said erase gate positioned over the second region and insulated therefrom;
- wherein said upper surface of said floating gate has a single step like non-planar contour such that said second side wall is taller than said first side wall.

7. The memory cell of claim 6 wherein said erase gate overhangs a portion of said floating gate.

8. A method of fabricating a non-volatile memory cell, said method comprising:
- forming a first polysilicon layer on a first insulating layer on a semiconductor substrate, said first polysilicon layer having a top surface with a planar contour;
- etching the top surface of said first polysilicon layer to produce a non-planar contour;
- forming a second insulating layer on said top surface of said first polysilicon layer, with said second insulating layer substantially uniform in thickness over said top surface;
- forming a second polysilicon layer on said second insulating layer, said second polysilicon layer having a bottom surface with a contour that substantially follows the non-planar contour of said top surface of said first polysilicon layer;
- masking and cutting said second polysilicon layer, said second insulating layer, and said first polysilicon layer, to form a coupling gate and a floating gate, respectively;
- forming a word line gate and an erase gate, on adjacent but respective opposite sides of said coupling gate and said floating gate;
- forming source and drain regions in said substrate;
- wherein said non-planar contour of said top surface of said first polysilicon layer has a single step such that a first side wall of the floating gate adjacent but separated from the erase gate is shorter than a second side wall of the floating gate opposite the first side wall and adjacent but separated from the word line gate.

9. The method of claim 8 wherein said source is formed underneath the erase gate.

10. The method of claim 8, wherein said drain is formed adjacent to the word line gate.

* * * * *